United States Patent
Miyata et al.

(10) Patent No.: US 6,821,650 B2
(45) Date of Patent: Nov. 23, 2004

(54) ORGANIC ELECTRO-LUMINESCENCE DEVICE

(75) Inventors: Seizo Miyata, Tokyo (JP); Yuki Sakuratani, Tokyo (JP); Junsheng Yu, Tokyo (JP)

(73) Assignee: SKC Co. Ltd., Suwon (KR)

( * ) Notice: Subject to any disclaimer, the term of this patent is extended or adjusted under 35 U.S.C. 154(b) by 0 days.

(21) Appl. No.: 10/380,062

(22) PCT Filed: Sep. 12, 2001

(86) PCT No.: PCT/KR01/01534

§ 371 (c)(1),
(2), (4) Date: Mar. 12, 2003

(87) PCT Pub. No.: WO02/22760

PCT Pub. Date: Mar. 21, 2002

(65) Prior Publication Data

US 2004/0018385 A1 Jan. 29, 2004

(51) Int. Cl.[7] ............................................. H05B 33/14
(52) U.S. Cl. ...................... 428/690; 428/917; 313/504; 313/506
(58) Field of Search ................ 428/690, 917; 313/504, 506; 252/301.16

(56) References Cited

U.S. PATENT DOCUMENTS

| | | | | | |
|---|---|---|---|---|---|
| 3,912,724 | A | * | 10/1975 | Begland | 546/188 |
| 3,962,220 | A | * | 6/1976 | Begland | 548/455 |
| 3,962,221 | A | * | 6/1976 | Begland | 548/455 |
| 4,002,616 | A | * | 1/1977 | Neumer | 548/455 |
| 5,792,568 | A | | 8/1998 | Emoto et al. | 428/690 |
| 6,010,796 | A | | 1/2000 | Kijima | 428/690 |

FOREIGN PATENT DOCUMENTS

| | | | |
|---|---|---|---|
| DE | 2611697 A | * | 9/1977 |
| JP | 07-090260 A2 | | 4/1995 |
| JP | 11-251067 | | 9/1999 |
| JP | 2001223080 A | * | 8/2001 |

OTHER PUBLICATIONS

Journal of Macromolecular Science, Pure and Applied Chemistry, A38 (12), p. 1539–1547 (2001).*
Japanese Journal of Applied Physics, Part 1: Regular Papers, Short Notes & Review Papers, 40(5A), pp. 3201–3205, (2001).*
Dyes and Pigments, vol. 47, Issues 1–2, Oct. 2000, pp. 107–115.*

* cited by examiner

Primary Examiner—Dawn Garrett
(74) Attorney, Agent, or Firm—Nixon & Vanderhye, P.C.; Frank P. Presta (57) ABSTRACT

Provided is a high-luminance, high-color purity red-emitting organic electroluminescent device. In the organic electroluminescent device with an organic layer including an emissive layer between an anode and a cathode, the organic layer contains a compound having the following formula as a light-emitting material:

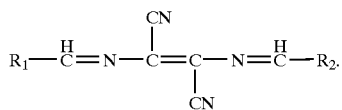

8 Claims, 3 Drawing Sheets

Example 1

FIG. 6

Example 1

ORGANIC ELECTRO-LUMINESCENCE DEVICE

TECHNICAL FIELD

The present invention relates to organic electroluminescent devices, and more particularly, to an organic electroluminescent device capable of emitting a high-luminance, high-color purity red light.

BACKGROUND ART

Rapid changing to information oriented society needs high-definition, high-efficiency, light-weight displays for personal computers or televisions. Cathode ray tubes (CRTs), the most widely used display devices, have an advantage of high-picture quality but with drawbacks of large volume and heavy weight. Thin-film type liquid crystal displays (LCDs) have been used in notebook computers. However, these LCDs are non-self-luminous types, so they have poor luminance, narrow viewing angle and poor picture quality, compared to CRTs. LCDs also have a slow response time and cannot be applied in the manufacture of large-screen displays.

Recently, organic electroluminescent (EL) devices are receiving a lot of attention for the ability to give high picture quality and to be manufactured as a thin film like for LCDs. The organic EL device includes a thin organic layer between two electrodes as a single layer or a stack of multiple layers, wherein one of the electrodes is transparent. When a voltage is applied between the electrodes, the cathode injects electrons into the lowest unoccupied molecular orbital (LUMO) of the organic layer, while the anode injects holes into the highest occupied molecular orbital (HOMO) of the organic layer, and excitons are formed by the recombination of the electrons and holes injected into the organic layer. As these excitons lose their activity by radiation, light is emitted and propagates externally through the transparent electrode.

C. W. Tang et al. reported first in 1987 the performance of organic EL devices for practical use (Applied Physics Letters, No. 51(12), pp. 913–915). They suggested a stacked structure of organic layers including a thin film (hole transporting layer) formed of diamine derivative and a thin film (electron transporting emissive layer) formed of tri(8-quinolinolato)aluminum (hereinafter, "Alq$_3$"). By employing the stack structure of organic layers, electron and hole injection barriers from electrodes to the organic layers are lowered and probability of electron-hole recombination in the organic layers is increased.

C. Adachi et al. disclosed a three-layered organic EL device including a hole transporting layer, an emissive layer and an electron transporting layer (Japanese Journal of Applied Physics, No. 27(2), pp, L269–L271, 1988) and a two-layered organic EL device including a hole transporting emissive layer and an electron transporting layer (Applied Physics Letter, No. 55(15), pp. 1489–1491, 1989). Also, it was taught that formation of a variety of appropriate multi-layer structures in the consideration of material compositions could optimize device characteristics.

C. W. Tang et al. developed a device structure having a Alq$_3$ electron transporting emissive layer doped with a light-emitting material such as cumalin derivatives, 4-dicyanomethylene-6-(p-dimethylaminostyryl)-2-methyl-4H-pyrane (hereinafter, "DCM") and the like (Journal of Applied Physics, No. (65(9), pp. 3610–3616, 1989). This structure effectively increases the use of the light-emitting material that exhibits poor film formability and undergoes concentration quenching when used alone.

For a full-color display, organic EL devices of three primary colors, red, green, and blue, are required. Of these devices, the red-emitting device needs the most improvement, and its luminance and color purity are insufficient. As an example, the emission spectrum of DCM used as a red-emitting material has a peak wavelength of about 600 nm and a wide half band width of about 100 nm. Thus, red color purity in the emission is too low to achieve a full color display.

Europium, embedded into an organometallic complex as a metal core, has been identified as a high-color purity red-emitting material. However, europium-based organic EL devices have very low maximum luminance.

Japanese Patent Laid-open Publication No. hei 11-329731 discloses a high-luminance, red-emitting, organic EL device manufactured using a specific distyryl compound. However, the emission spectrum of the EL device shows a large half band width of 100 nm or greater and it is undesirable in terms of color purity.

Therefore, there is a need to implement a high-luminance, high-color purity, red-emitting organic EL device with a narrow half band width in its emission spectrum.

DISCLOSURE OF THE INVENTION

It is an objective of the present invention to provide a high-luminance, high-color purity, red-emitting, organic electroluminescent (EL) device.

In approaching to the objective of the present invention, the present inventors have found that light-emitting materials having formula (1) and (2) below is have narrow half band widths in their emission spectra:

Chemical Formula 1

Chemical Formula 2 where A$_1$ is a functional group having electron acceptor activity, D$_1$ and D$_2$ are the same or different functional groups having electron donor activity, D$_3$ is a functional group having electron acceptor activity, A$_2$ and A$_3$ are the same or different functional groups having electron donor activity.

The present inventors have also found that a high-luminance, high-color purity red-emitting organic EL device according to the present invention can be implemented with a particular one of formula (1) above.

The present invention provides an organic EL device with an organic layer including an emissive layer between an anode and a cathode, the organic layer comprising at least one compound having formula (3) below as a light-emitting material that is responsive to current injection:

Chemical formula 3 where the substituent groups of ethylene groups are in a cis or trans form; R$_1$ and R$_2$ are the same or different groups and are benzo 5-membered heterocyclic groups having 0 to 4 methyl groups, benzo 6-membered heterocyclic groups having 0 to 4 methyl groups, phenyl groups having 0 to 3 substituent groups selected from Table 1 below, naphthyl groups having 0 to 3 substituent groups selected from Table 1 below, 5-membered heterocyclic groups having 0 to 3 substituent groups selected from Table 1 below, or 6-membered heterocyclic groups having 0 to 3 substituent groups selected from Table 1 below:

TABLE 1 where $R_3$ is a halogen atom, $R_4$ is an alkyl group having 1 to 4 carbon atoms; $R_5$ is an alkylene group having 1 to 4 carbon atoms; $R_6$ is an alkylene group having 2 to 4 carbon atoms; $R_7$ is a substituent selected from Table 2 below, a phenyl group having 0 to 2 substituent groups selected from Table 4 below, or a naphthyl group having 0 to 4 substituent groups selected from Table 4 below; $R_8$ is a substituent group selected from Table 3 below, a phenyl group having 0 to 2 substituent groups selected from Table 4 below, or a naphthyl group having 0 to 4 substituent groups selected from Table 4 below; $R_9$ is an alkyl group having 1 to 4 carbon atoms or a phenyl group having 0 to 2 substituent groups selected from Table 4 below; $R_{10}$ is an halogen atom, an alkoxy group having 1 to 4 carbon atoms, or a phenyl group having 0 to 2 substituent groups selected from Table 4 below; $R_{11}$ is a cycloalkyl group having 5 to 6 carbon atoms, an alkyl group having 1 to 4 carbon atoms, 2-hydroxyethyl group, or a phenyl group having 0 to 2 substituent groups selected from Table 4:

TABLE 2

TABLE 3

TABLE 3-continued

TABLE 4 where $R_{12}$ is an alkyl group having 1 to 4 carbon atoms; $R_{13}$ is an alkylene group having 2 to 4 carbon atoms; $R_{14}$ is an halogen atom; $R_{15}$ is an alkylene group having 1 to 4 carbon atoms; $R_{16}$ is an alkyl group having 1 to 4 carbon atoms or a phenyl group having 0 to 2 substituent groups selected from Table 4 below; and $R_{17}$ and $R_{18}$ are the same or different and are alkyl groups having 1 to 4 carbon atoms or hydrogen atom.

By using the light-emitting material of formula (3) above, a high-luminance, high-color purity red-emitting organic EL device can be realized. The compounds of formula (3) may be used alone or in conjunction with other materials.

In the organic EL device according to the present invention, the light-emitting material of formula (3) above may have a molecular structure of formulae (4), (5), (6), (7), (8), (9), (10), (11), (12), (13), (14), (15), (16) and (17) below:

Chemical Formula (4)

Chemical Formula (5)

Chemical Formula (6)

Chemical Formula (7)

Chemical Formula (8)

Chemical Formula (9)

Chemical Formula (10)

Chemical Formula (11)

Chemical Formula (12)

Chemical Formula (13)

Chemical Formula (14)

Chemical Formula (15)

Chemical Formula (16)

16

Chemical Formula (17)

17 where the substituent groups of ethylene in each formula are in a cis or trans form.

*EXPLANATION OF REFERENCE NUMERALS

1; substrate
2; anode (transparent electrode)
3; cathode
4, 4a, 4b; organic layer
5; hole transporting layer
6; electron transporting emissive layer
7; hole transporting emissive layer
8; electron transporting layer
9; hole transporting layer
10; emissive layer
11; electron transporting layer
A, B, C, and D; organic EL device

BEST MODE FOR CARRYING OUT THE INVENTION

Preferred embodiments of an organic electroluminescent (EL) device according to the present invention are illustrated in FIGS. 1 through 4.

Figure 1:
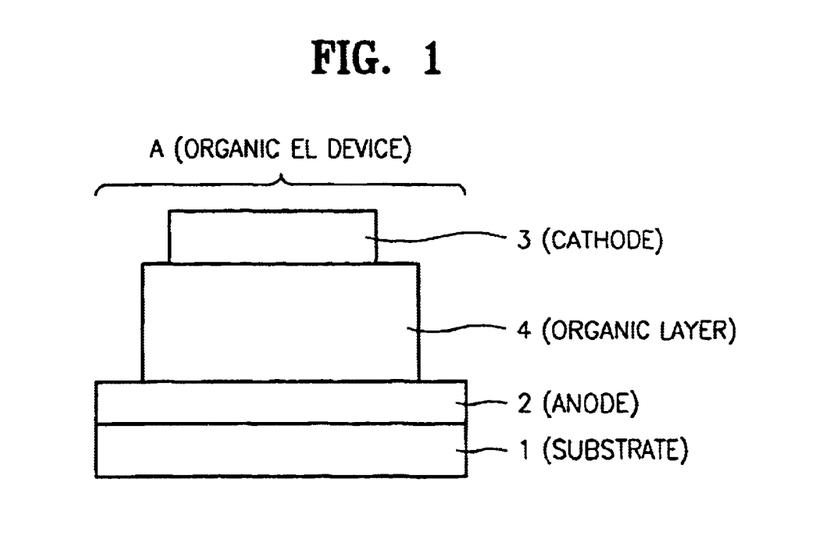
FIG. 1 is a sectional view of the main portion of a first embodiment of an organic electroluminescent (EL) device according to the present invention.

For the organic EL device A shown in FIG. 1, reference numeral 1 denotes a substrate. The substrate 1 may be formed of glass, plastic and the like. Reference numeral 2 denotes an anode (transparent electrode). The anode 2 may be formed of indium tin oxide (ITO), $SnO_2$ and the like.

Reference numeral 3 denotes a cathode. The cathode 3 may be formed of a variety of materials that are commonly used in the field, for example, metals including Li, Mg, Ca, Ag, Al, In, and an alloy of these metals. The cathode 3 may be formed as a single layer or a multi-layer including at least two layers.

In FIG. 1, reference numeral 4 denotes an organic layer. The organic layer 4 of the organic EL device A includes at least one compound having formula (3) above as a light-emitting material. The organic layer 4 may have any well-known structure. For example, the organic layer 4 may be formed as a single layer or a multi-layer including at least two layers. The organic layer 4 includes at least one emissive layer. Also, at least one emissive layer of the organic layer 4, which can include multiple emissive layers, contains at least one compound having formula (3) above as a light-emitting material. Each constituent layer of the organic layer 4 may be formed of one kind of material or of at least two kinds of materials.

An organic EL device according to the present invention may include an organic layer formed as a stack of a hole transporting layer and an electron transporting emissive layer. In this case, the electron transporting emissive layer may contain the compound of formula (3) above as a light-emitting material. The organic EL device having this structure is illustrated in FIG. 2.

Figure 2:
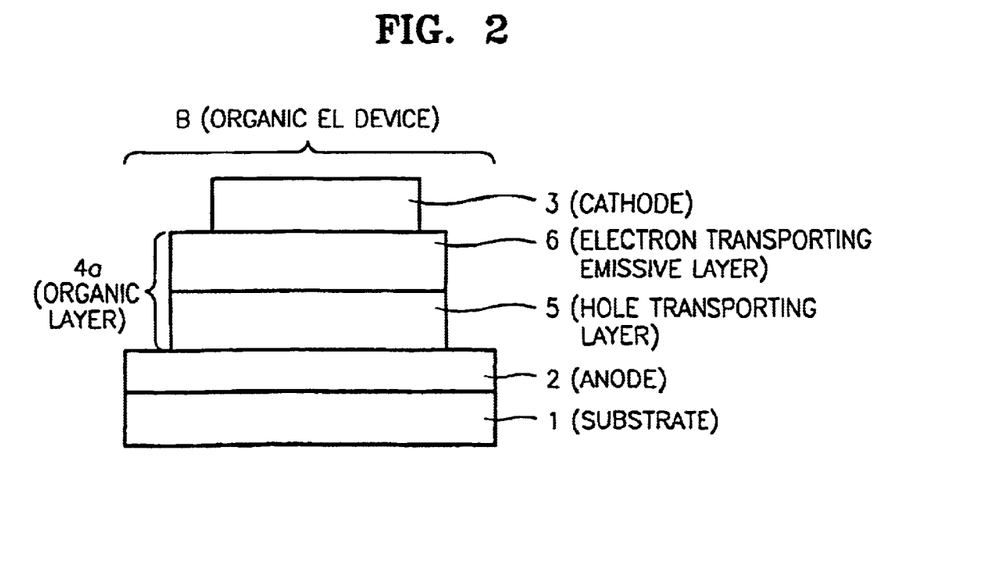
FIG. 2 is a sectional view of the main portion of a second embodiment of the organic EL device according to the present invention.

For the organic EL device B shown in FIG. 2, reference numeral 1 denotes a substrate for device. The substrate 1 may be formed of glass, plastic and the like. Reference numeral 2 denotes an anode (transparent electrode). The anode 2 may be formed of ITO, $SnO_2$ and the like. Reference numeral 3 denotes a cathode. The cathode 3 may be formed of a variety of materials that are commonly used in the field, for example, metals including Li, Mg, Ca, Ag, Al, In, and an alloy of these metals. The cathode 3 may be formed as a single layer or a multi-layer including at least two layers.

For the organic EL device B shown in FIG. 2, an organic layer 4a is formed as a stack of a hole transporting layer 5 and an electron transporting emissive layer 6.

The hole transporting layer 5 of the organic EL device B shown in FIG. 2 may be formed of a variety of common hole transporting materials including 4,4-bis[N-(1-naphthyl)-N-phenyl-amine]biphenyl (α-NPD), N,N'-diphenyl-N,N'-bis (3-methylphenyl)-1,1'-biphenyl-4,4'-diamine (TPD), poly-(N-vinylcarbazole) (PVCz) and the like. The hole transporting layer 5 may be formed of one kind of material or of at least two kinds of materials. Alternatively, the hole transporting layer 5 may be formed as a stack of at least two different material layers.

The electron transporting emissive layer 6 of the organic EL device shown in FIG. 2 contains at least one compound having formula (3) above as a light-emitting material. The electron transporting emissive layer 6 may be formed of one compound alone or of at least two compounds together having formula (3) above. Alternatively, the electron transporting emissive layer 6 may be formed of a compound having formula (3) above along with another compound such as tri(8-quinolinolato)aluminum ($Alq_3$).

To improve device characteristics including emission efficiency and lifetime, the organic EL device B of FIG. 2 may further include a hole injecting layer or an anode buffer layer between the anode 2 and the hole transporting layer 5. The hole injecting layer or anode buffer layer may be formed of a variety of common materials such as copper phthalocyanine. For the same purpose, an electron injecting layer or a cathode buffer layer may be interposed between the cathode 3 and the electron transporting emissive layer 6. The electron injecting layer or cathode buffer layer may be formed of a variety of common materials such as LiF.

An organic EL device according to the present invention may include an organic layer formed as a stack of a hole transporting emissive layer and an electron transporting layer. In this case, the hole transporting emissive layer may contain the compound of formula (3) above as a light-emitting material. The organic EL device having this structure is illustrated in FIG. 3.

Figure 3:
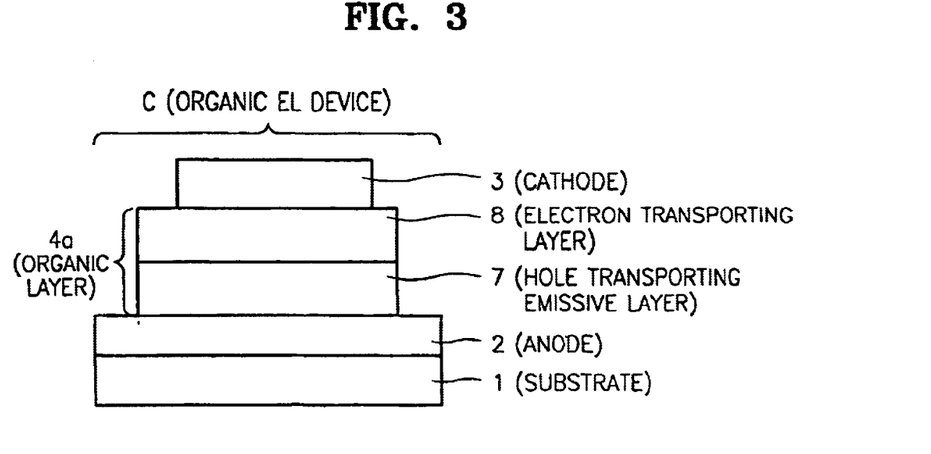
FIG. 3 is a sectional view of the main portion of a third embodiment of the organic EL device according to the present invention.

For the organic EL device C shown in FIG. 3, reference numeral 1 denotes a substrate for device. The substrate 1 may be formed of glass, plastic and the like. Reference numeral 2 denotes an anode (transparent electrode). The anode 2 may be formed of ITO, $SnO_2$ and the like. Reference numeral 3 denotes a cathode. The cathode 3 may be formed of a variety of materials that are commonly used in the field, for example, metals including Li, Mg, Ca, Ag, Al, In, and an alloy of these metals. The cathode 3 may be formed as a single layer or a multi-layer including at least two layers.

For the organic EL device C shown in FIG. 3, an organic layer 4a' is formed as a stack of a hole transporting emissive layer 7 and an electron transporting layer 8.

The hole transporting emissive layer 7 of the organic EL device C shown in FIG. 3 contains at least one compound having formula (3) above as a light-emitting material. The hole transporting emissive layer 7 may be formed of one compound alone or of at least two compounds together having formula (3) above. Alternatively, the hole transporting emissive layer 7 may be formed of a compound having formula (3) above along with another compound such as TPD.

The electron transporting layer 8 of the organic EL device shown in FIG. 3 may be formed of a variety of common electron transporting materials including $Alq_3$. The electron transporting layer 8 may be formed of one material alone or of at least two kinds of materials together. Alternatively, the electron transporting layer 8 may be formed as a stack of at least two different material layers.

To improve device characteristics including emission efficiency and lifetime, the organic EL device C of FIG. 3 may further include a hole injecting layer or an anode buffer layer between the anode 2 and the hole transporting emissive layer 7. The hole injecting layer or anode buffer layer may be formed of a variety of common materials such as copper phthalocyanine. For the same purpose, an electron injecting layer or a cathode buffer layer may be interposed between the cathode 3 and the electron transporting layer 8. The electron injecting layer or cathode buffer layer may be formed of a variety of common materials such as LiF.

An organic EL device according to the present invention may include an organic layer formed as a stack of a hole transporting layer, an emissive layer and an electron transporting layer. In this case, the emissive layer may contain the compound of formula (3) above as a light-emitting material. The organic EL device having this structure is illustrated in FIG. 4.

Figure 4:
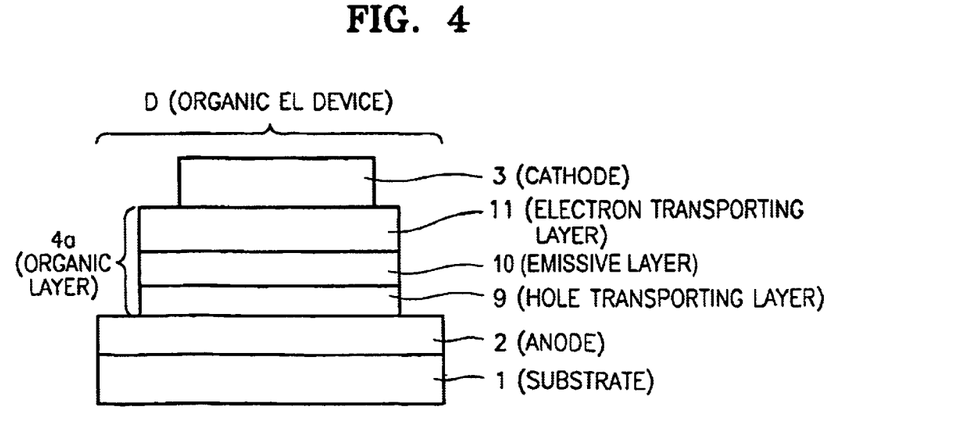
FIG. 4 is a sectional view of the main portion of a fourth embodiment of the organic EL device according to the present invention.

For the organic EL device D shown in FIG. 4, reference numeral 1 denotes a substrate for device. The substrate 1 may be formed of glass, plastic and the like. Reference numeral 2 denotes an anode (transparent electrode). The anode 2 may be formed of ITO, $SnO_2$ and the like. Reference numeral 3 denotes a cathode. The cathode 3 may be formed of a variety of materials that are commonly used in the field, for example, metals including Li, Mg, Ca, Ag, Al, In, and an alloy of these metals. The cathode 3 may be formed as a single layer or a multi-layer including at least two layers.

For the organic EL device D shown in FIG. 4, an organic layer 4b is formed as a stack of a hole transporting layer 9, an emissive layer 10 and an electron transporting layer 11.

The hole transporting layer 9 of the organic EL device D shown in FIG. 4 may be formed of a variety of common hole transporting materials including α-NPD, TPD and PVCz. The hole transporting layer 9 may be formed of one kind of material or of at least two kinds of materials. Alternatively, the hole transporting layer 9 may be formed as a stack of at least two different material layers.

The emissive layer 10 of the organic EL device D shown in FIG. 4 contains at least one compound having formula (3) above as a light-emitting material. The emissive layer 10 may be formed of one compound alone or of at least two compounds having formula (3) above. Alternatively, the emissive layer 10 may be formed of a compound having formula (3) above along with another compound such as $Alq_3$.

The electron transporting layer 11 of the organic EL device shown in FIG. 4 may be formed of a variety of common electron transporting materials including $Alq_3$. The electron transporting layer 11 may be formed of one kind of material or of at least two kinds of materials. Alternatively, the electron transporting layer 11 may be formed as a stack of at least two different material layers.

To improve device characteristics including emission efficiency and lifetime, the organic EL device D of FIG. 4 may further include a hole injecting layer or an anode buffer layer between the anode 2 and the hole transporting layer 9. The hole injecting layer or anode buffer layer may be formed of a variety of common materials such as copper phthalocyanine. For the same purpose, an electron injecting layer or a cathode buffer layer may be interposed between the cathode 3 and the electron transporting layer 11. The electron injecting layer or cathode buffer layer may be formed of a variety of common materials such as LiF.

The respective organic EL devices of FIGS. 1 through 4 operate with the application of a voltage between the anode 2 and the cathode 3. A direct current, pulsed current or alternating current is applied to induce voltage, but the direct current is most commonly applied.

The present invention will be described in greater detail by means of the following examples. The following examples are for illustrative purposes and not intended to limit the scope of the invention.

EXAMPLE 1

An organic EL device having the structure as shown in FIG. 2 was manufactured using the compound of formula (17) above as a light-emitting material.

An ITO coated glass substrate with a transparent electrode (Asahi Glass Co., 8Ω/square sheet resistance) was untrasonically cleaned in an aqueous detergent, deinized water, isopropyl alcohol, and then methanol. Next, PVCz of formula (18) below and TPD of formula (19) below were spin coated in a molar ratio of 1:1 to form a 40-nm-thick electron transporting layer on the ITO coated glass substrate.

Chemical Formula 18

18

Chemical Formula 19

19

Alq$_3$ of formula (20) below and the compound of formula (17) above were simultaneously vacuum deposited in a weight ratio of 100:1 at a rate of 0.1 nm/sec to form a 50-nm-thick electron transporting emissive layer on the hole transporting layer.

Chemical Formula 20

20

Mg and Ag were simultaneously vacuum deposited in a weight ratio of 10:1 to form a 600-nm-thick cathode, thereby resulting in an organic EL device having the structure as shown in FIG. 2. In vacuum deposition for the cathode, a mask was used to form the circular cathode of a diameter of 3 mm.

Figure 5:
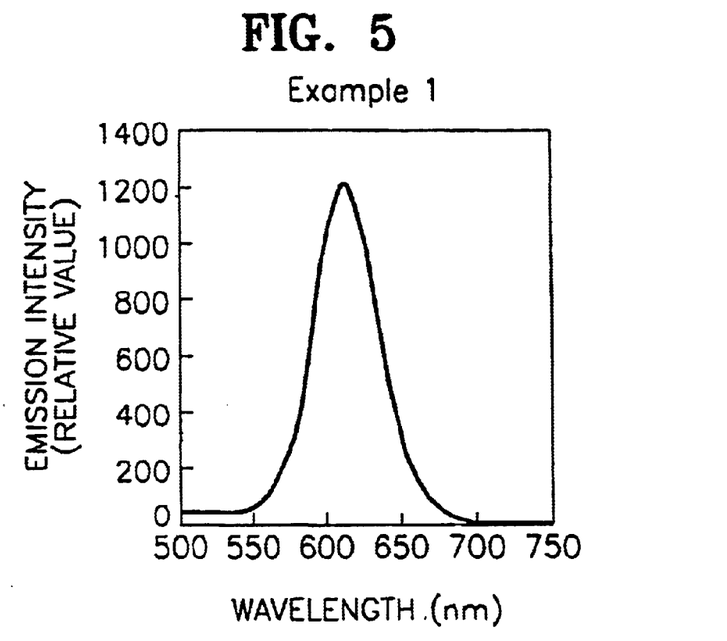
FIG. 5 shows the emission spectrum of an organic EL device according to the present invention manufactured in Example 1.
Figure 6:
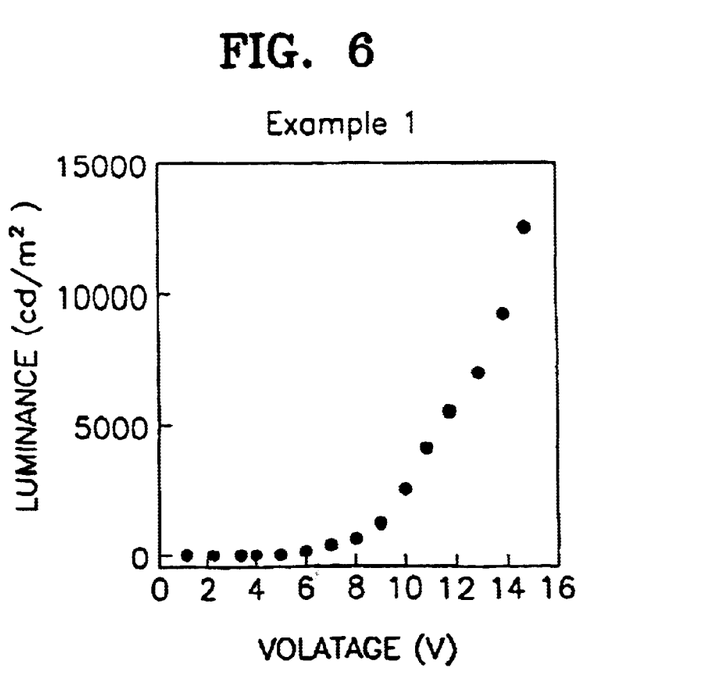
FIG. 6 is a graph of voltage-luminance characteristics of the organic EL device according to the present invention manufactured in Example 1.

The organic EL device manufactured in Example 1 was forward (DC) biased to determine emission characteristics. Red light emission was visible from the organic EC device. The EL spectrum of the device, measured by FP-77 spectrometer (Japan), had an emission peak at 620 nm and a half band width of 50 nm, as shown in FIG. 5. As a result of a voltage-luminance characteristic determination, the organic EL device had a luminance of 12500 cd/m$^2$ at 15 volts, as shown in FIG. 6.

EXAMPLE 2

An organic EL device was manufactured in a similar manner as in Example 1, except that the compound of formula (4) above was used instead of the compound of formula (17). The EL spectrum of this organic EL device had an emission peak at 640 nm and a half band width of 45 nm. The organic EL device had a maximum luminance of 10700 cd/m$^2$ at 15 volts.

EXAMPLE 3

An organic EL device was manufactured in a similar manner as in Example 1, except that the compound of formula (5) above was used instead of the compound of formula (17). The EL spectrum of this organic EL device had an emission peak at 602 nm and a half band width of 65 nm. The organic EL device had a maximum luminance of 11300 cd/M$^2$ at 16 volts.

EXAMPLE 4

An organic EL device was manufactured in a similar manner as in Example 1, except that the compound of formula (8) above was used instead of the compound of formula (17). The EL spectrum of this organic EL device had an emission peak at 610 nm and a half band width of 50 nm. The organic EL device had a maximum luminance of 9200 cd/m$^2$ at 15 volts.

EXAMPLE 5

An organic EL device was manufactured in a similar manner as in Example 1, except that the compound of formula (12) above was used instead of the compound of formula (17). The EL spectrum of this organic EL device had an emission peak at 607 nm and a half band width of 41 nm. The organic EL device had a maximum luminance of 8700 cd/m$^2$ at 15 volts.

EXAMPLE 6

An organic EL device was manufactured in a similar manner as in Example 1, except that the compound of formula (12) above was used instead of the compound of formula (17). The EL spectrum of this organic EL device had an emission peak at 648 nm and a half band width of 63 nm. The organic EL device had a maximum luminance of 9700 cd/m$^2$ at 15 volts.

EXAMPLE 7

An organic EL device was manufactured in a similar manner as in Example 1, except that the compound of formula (15) above was used instead of the compound of formula (17). The EL spectrum of this organic EL device had an emission peak at 632 nm and a half band width of 44 nm. The organic EL device had a maximum luminance of 11000 cd/m$^2$ at 16 volts.

INDUSTRIAL APPLICABILITY

In an organic EL device with an organic layer including an emissive layer between the anode and cathode according to the present invention, the organic layer contains at least one compound of formula (3) above; thereby enabling the organic EL device to emit a high luminance, high-color purity red light.

What is claimed is:

1. An organic electroluminescent device with an organic layer including an emissive layer between an anode and a cathode, the organic layer comprising at least one compound having formula (3) below as a light-emitting material:

Chemical formula 3

3 where the substituent groups of ethylene groups are in a cis or trans form; R$_1$ and R$_2$ are the same or different groups and are benzo 5-membered heterocyclic groups having 0 to 4 methyl groups, benzo-6-membered heterocyclic groups having 0 to 4 methyl groups, phenyl groups having 0 to 3 substituent groups selected from Table 1, naphthyl groups having 0 to 3 substituent groups selected from Table 1, 5-membered heterocyclic groups having 0 to 3 substituent groups selected from Table 1, or 6-membered heterocyclic groups having 0 to 3 substituent groups selected from Table 1:

TABLE 1

| —$NO_2$ | $\overset{H}{-N}-\overset{\overset{O}{\|}}{C}-NH_2$ |
|---|---|
| —$R_3$ | $-\overset{H}{N}-R_7$ |
| —CN<br>—$R_4$<br>—O—$R_4$ | $-N\overset{R_7}{\underset{R_8}{\diagdown}}$ |
| $-O-\overset{H_2}{C}-\phantom{X}\text{(phenyl)}$ | $-\overset{H}{N}-\overset{\overset{O}{\|}}{C}-R_9$ |
| —(phenyl) | $-\overset{H}{N}-\overset{\overset{O}{\|}}{\underset{\underset{O}{\|}}{S}}-R_9$ |
| —$CF_3$<br>—OH | —$R_4$—$R_{10}$ |
| $-O-R_5-N\overset{R_4}{\underset{R_4}{\diagdown}}$ | —S—$R_{11}$ |
| —$R_6$—$CH_3$ | $-\overset{\overset{O}{\|}}{\underset{\underset{O}{\|}}{S}}-R_{11}$ | where $R_3$ is a halogen atom, $R_4$ is an alkyl group having 1 to 4 carbon atoms; $R_5$ is an alkylene group having 1 to 4 carbon atoms; $R_6$ is an alkylene group having 2 to 4 carbon atoms; $R_7$ is a substituent selected from Table 2, a phenyl group having 0 to 2 substituent groups selected from Table 4, or a naphthyl group having 0 to 4 substituent groups selected from Table 4; $R_8$ is a substituent group selected from Table 3, a phenyl group having 0 to 2 substituent groups selected from Table 4, or a naphthyl group having 0 to 4 substituent groups selected from Table 4; $R_9$ is an alkyl group having 1 to 4 carbon atoms or a phenyl group having 0 to 2 substituent groups selected from Table 4; $R_{10}$ is an halogen atom, an alkoxy group having 1 to 4 carbon atoms, or a phenyl group having 0 to 2 substituent groups selected from Table 4; $R_{11}$ is a cycloalkyl group having 5 to 6 carbon atoms, an alkyl group having 1 to 4 carbon atoms, 2-hydroxyethyl group, or a phenyl group having 0 to 2 substituent groups selected from Table 4:

TABLE 2

—$R_{12}$
—$R_{13}$—CN
—$R_{13}$—$R_{14}$
—$R_{13}$—OH

—$R_{13}$—(phenyl)

—$R_{13}$—O—$R_{12}$ $-R_{13}-\overset{\overset{O}{\|}}{C}-R_{15}-CN$ $-R_{13}-\overset{\overset{O}{\|}}{C}-O-R_{16}$ $-R_{13}-O-\overset{\overset{O}{\|}}{C}-R_{16}$ $-R_{13}-O-\overset{\overset{O}{\|}}{C}-\overset{H}{N}-R_{16}$ $-R_{13}-\overset{\overset{O}{\|}}{C}-R_{15}-O-\overset{\overset{O}{\|}}{C}-R_{16}$

TABLE 3

—$R_{12}$
—$R_{13}$—CN
—$R_{13}$—$R_{14}$
—$R_{13}$—OH

—N(phthalimide)

—$R_{13}$—(phenyl)

—$R_{13}$—$R_{15}$—CN

—N(glutarimide)

$-R_{13}-\overset{\overset{O}{\|}}{C}-O-R_{16}$

—N(succinimide)

$-R_{13}-O-\overset{\overset{O}{\|}}{C}-R_{16}$ $\quad -R_{13}-O-\overset{\overset{O}{\|}}{C}-\overset{H}{C}=C$

$-R_{13}-\overset{\overset{O}{\|}}{C}-O-R_{15}-O-\overset{\overset{O}{\|}}{C}-R_{16}$ $-R_{13}-\overset{H_2}{C}-CH\overset{O-\overset{\overset{O}{\|}}{C}-R_{16}}{\underset{H_2C-O-R_{16}}{\diagdown}}$

TABLE 3-continued

TABLE 4 where $R_{12}$ is an alkyl group having 1 to 4 carbon atoms; $R_{13}$ is an alkylene group having 2 to 4 carbon atoms; $R_{14}$ is an halogen atom; $R_{15}$ is an alkylene group having 1 to 4 carbon atoms; $R_{16}$ is an alkyl group having 1 to 4 carbon atoms or a phenyl group having 0 to 2 substituent groups selected from Table 4; and $R_{17}$ and $R_{18}$ are the same or different and are alkyl groups having 1 to 4 carbon atoms or hydrogen atom.

2. The organic electroluminescent device of claim 1, wherein the organic layer comprises a hole transporting layer and an electron transporting emissive layer stacked sequentially, and the electron transporting emissive layer comprises at least one compound having the formula (3) as a light-emitting material.

3. The organic electroluminescent device of claim 1, wherein the organic layer comprises a hole transporting layer, and an electron transporting layer stacked sequentially, and the hole transporting emissive layer comprises at least one compound having the formula (3) as a light-emitting material.

4. The organic electroluminescent device of claim 1, wherein the organic layer comprises a hole transporting layer, an emissive layer, and an electron transporting layer stacked sequentially, and the emissive layer comprises at least one compound having the formula (3) as a light-emitting material.

5. An organic electroluminescent device with an organic layer including an emissive layer between an anode and a cathode, the organic layer comprising at least one compound selected from the group consisting of compounds having formula (4), (5), (6), (7), (8), (9), (10), (11), (12), (13), (14), (15), (16) and (17) below:

Chemical Formula (4)

4

Chemical Formula (5)

5

Chemical Formula (6)

6

Chemical Formula (7)

7

Chemical Formula (8)

8

Chemical Formula (9)

9

Chemical Formula (10)

10

Chemical Formula (11)

11

Chemical Formula (12)

12

-continued

Chemical Formula (13)

13

Chemical Formula (14)

14

Chemical Formula (15)

15

Chemical Formula (16)

16

Chemical Formula (17)

17 where the substituent groups of ethylene groups in each formula are in a cis or trans form.

6. The organic electroluminescent device of claim 5, wherein the organic layer comprises a hole transporting layer and an electron transporting emissive layer stacked sequentially, and the electron transporting emissive layer comprises at least one compound selected from the group consisting of the compounds having formula (4), (5), (6), (7), (8), (9), (10), (11), (12), (13), (14), (15), (16) and (17) as a light-emitting material.

7. The organic electroluminescent device of claim 5, wherein the organic layer comprises a hole transporting emissive layer and an electron transporting emissive layer stacked sequentially, and the hole transporting emissive layer comprises at least one compound selected from the group consisting of the compounds having formula (4), (5), (6), (7), (8), (9), (10), (11), (12), (13), (14), (15), (16) and (17) as a light-emitting material.

8. The organic electroluminescent device of claim 5, wherein the organic layer comprises a hole transporting layer, an emissive layer, and an electron transporting layer stacked sequentially, and the emissive layer comprises at least one compound selected from the group consisting of the compounds having formula (4), (5), (6), (7), (8), (9), (10), (11), (12), (13), (14), (15), (16) and (17) as a light-emitting material.

* * * * *